United States Patent [19]

May

[11] 4,405,869
[45] Sep. 20, 1983

[54] OPTICAL PARAMETRONS

[76] Inventor: George A. May, R.R. 1, E. Sooke Rd., Sooke, B. C., Canada, V0S 1N0

[21] Appl. No.: 412,178

[22] Filed: Aug. 27, 1982

[51] Int. Cl.³ .............................................. G11C 11/20
[52] U.S. Cl. .................................... 307/405; 307/428
[58] Field of Search ............... 307/402, 404, 405, 424, 307/425, 427, 428; 330/4.5, 252; 455/618, 619

[56] References Cited

U.S. PATENT DOCUMENTS

| | | | |
|---|---|---|---|
| 2,815,488 | 12/1957 | Von Neumann | 332/52 |
| 2,838,687 | 6/1958 | Clary, Jr. | 307/88 |
| 3,108,195 | 10/1963 | Feng Wu | 307/88 |
| 3,126,486 | 3/1964 | McMillan | 307/88 |
| 3,201,709 | 8/1965 | Boyd | 330/4.5 |
| 3,387,204 | 6/1968 | Ashkin et al. | 321/69 |
| 3,395,289 | 7/1968 | Powell | 307/88 |
| 3,515,897 | 6/1970 | Culver | 307/88.3 |
| 3,590,249 | 6/1971 | Rabedeau | 455/619 |
| 3,602,724 | 8/1971 | Smith | 307/88.3 |
| 3,655,993 | 4/1972 | Wolff | 307/88.3 |
| 3,663,886 | 5/1972 | Blume | 330/4.5 |

FOREIGN PATENT DOCUMENTS

778883 7/1957 United Kingdom .

OTHER PUBLICATIONS

Tunable Optical Parametric Amplifiers by D. Weinberg, Apr. 1969.
The Parametron, A Digital Computing Element Which Utilizes Parametric Oscillation by E. Goto, Aug. 1959.
Microwave Parametric Subharmonic Oscillators for Digital Computing by F. Sterger, Aug. 1959.

*Primary Examiner*—Michael L. Gellner
*Assistant Examiner*—Derek Jennings
*Attorney, Agent, or Firm*—Limbach, Limbach & Sutton

[57] ABSTRACT

A computing system is disclosed including a new optical parametric logic gate. The parametric logic gate includes an optical resonant cavity having nonlinear optical characteristics, such that the cavity will generate a subharmonic output signal having a frequency f when supplied with a pump frequency of 2f. The subharmonic output signal may have one of two possible phases which differ by $\pi$ radians to one another, and correspond to binary 1 and 0 respectively. A bias signal having a frequency f is supplied to the resonant cavity. Optical input signals are summed with the bias signal to produce a resultant seed input signal having one of the two phases. The phase of the seed input signal is imparted to the phase of the output subharmonic. The type of logical operation which the parametron performs can be controlled by adjusting the power of the bias signal. The subject disclosure also includes a description of computing systems having various pump arrangements. In addition, data input/output interfaces are disclosed.

6 Claims, 9 Drawing Figures

OPTICAL PARAMETRONS

DESCRIPTION

Technical Field

The subject invention relates to optical logic gates for digital computing. More particularly, logic gates are disclosed formed from optical parametric oscillators that are particularly adapted for high speed computer applications.

BACKGROUND OF THE INVENTION

Parametric oscillators and their use in digital computers have been known for many years. The concept can be traced back to the early 1950's when, for example, Eiichi Goto published a detailed explanation of parametrons in a paper entitled, "The Parametron, a Digital Computing Element Which Utilizes a Parametric Oscillation," appearing in the Proceedings of the IRE, Vol. No. 47, No. 8, August 1959.

A parametron element is essentially a resonant circuit with a reactive element varying periodically at a frequency 2f which generates a parametric oscillation at a subharmonic frequency f. As originally conceived, the periodic variation is achieved by applying an exciting current of frequency 2f to a balanced pair of nonlinear reactors, such as ferrite-core coils and nonlinear capacitors made of ferroelectric material, or semiconductor junctions.

The subharmonic parametric oscillation generated is phase locked and is stable in either of two phases which differ by $\pi$ radians with respect to each other. It was recognized by Goto that these two phases could be used to represent binary 1 and 0, respectively. The phase of the oscillation can be selected by the application of a small control or information input signal to the resonant circuit, in the early stages of its oscillation. Such an input signal produces a small initial oscillation in the parametron which serves as a "seed" or nucleus for determining the phase state of the parametron when it is in the active or excited condition.

Prior art parametric logic circuits can be manufactured without the use of diodes and rectifiers, such that at the time of their introduction, they were thought to be a suitable replacement for tubes in computing systems. Accordingly, a considerable amount of effort was expended in developing computing systems which relied on parametric oscillators. Examples of such developments can be found in U.S. Pat. Nos. 2,815,488, issued Dec. 3, 1957, to Von Neumann; 2,838,687, issued June 10, 1958, to Clary; 3,108,195, issued Oct. 22, 1963, to Feng Wu; and 3,395,289, issued July 30, 1968 to Powell.

The above cited references describe in detail various parametric resonant circuits and methods for utilizing those circuits to construct logic gates. However, all of the known prior art parametrons are limited to arrangements wherein the resonant circuit includes a parallel inductance-capacitance arrangement which is tuned to a desired frequency. In contrast, and as discussed more fully hereinbelow, the subject parametrons do not include any electromagnetic components, but rather relates high speed optical gates.

In the prior art, it is known that optical resonant cavities can be manufactured by, for example, x-ray photolithography or electron lithography techniques. One method of construction includes the local diffusion of a material into a substrate for changing the local surface characteristics of the substrate. Many suitable construction techniques can be found in the fields of integrated thin film optics or integrated optics for communication purposes. Resonant circuits for the harmonic generation of coherent light are also known. The latter developments have typically been utilized with laser devices. Examples of such technology can be found in U.S. Pat. Nos. 3,201,709, issued Aug. 17, 1965, to Boyd; 3,602,724, issued Aug. 31, 1971 to Smith; and 3,655,993, issued Apr. 11, 1972 to Wolff.

Thus, the technology exists to supply optical resonant cavities suitable for parametric amplification. However, to date, it does not appear there has ever been any proposals for utilizing optical resonant cavities as parametric oscillators for use in digital computing.

Accordingly, it is an object of the subject invention to provide a new and improved digital computing element consisting of an optical parametric oscillator.

It is a further object of the subject invention to provide a new and improved optical parametric digital computing element which is capable of very high speed logic operations.

It is another object of the subject invention to provide new and improved constructions for modifying parametric oscillators into various types of logic gates.

It is still a further object of the subject invention to provide a new and improved computing system based on optical parametric oscillators.

It is still a further object of the subject invention to provide new and improved input interfaces particularly adapted for use with an optical parametric computer.

It is still a further object of the subject invention to provide a new and improved output interface particularly adapted for use with an optical parametric computer.

SUMMARY OF THE INVENTION

In accordance with these and many other objects, the subject invention provides for an optical parametric oscillator capable of performing logic operations in a digital computer. More particularly, the logic gate of the subject invention includes an optical resonant cavity having nonlinear optical characteristics. A pump frequency supply means is connected to the cavity and supplies an optical input having a frequency 2f. The resonant cavity is constructed such that when the supplied pump signal reaches a sufficient power level, the cavity will generate a subharmonic output signal having a steady oscillation at a frequency f, phase locked to the input pump frequency. As with all subharmonic parametric oscillators, two possible subharmonic phases are possible for the output signal which differ by $\pi$ radians to one another. These phases can be used to represent binary 1 and 0, respectively.

The optical parametric gate further includes a bias input which supplies a reference signal having a frequency f. The phase of the bias input signal effects the phase of the output subharmonic from the cavity. As discussed more fully hereinbelow, the power level of the bias input signal is adjusted to reflect the type of gate logic desired. Optical input signals carrying binary information are also supplied to the gate. The information input signals and the bias input signal are effectively summed to produce a resultant input signal. The phase of the resultant signal acts as a seed or nucleus for controlling the phase of the output subharmonic. The output subharmonic can be used as the input for downstream gates.

The subject disclosure also includes a plurality of proposed pump systems for use in a digital computer. In addition, data input and output interfaces are disclosed which are adapted for use with a computer utilizing optical parametric oscillators.

Further objects and advantages of the subject invention will become apparent from the following detailed description taken in conjunction with the drawings in which:

DETAILED DESCRIPTION OF THE INVENTION

Figure 1:
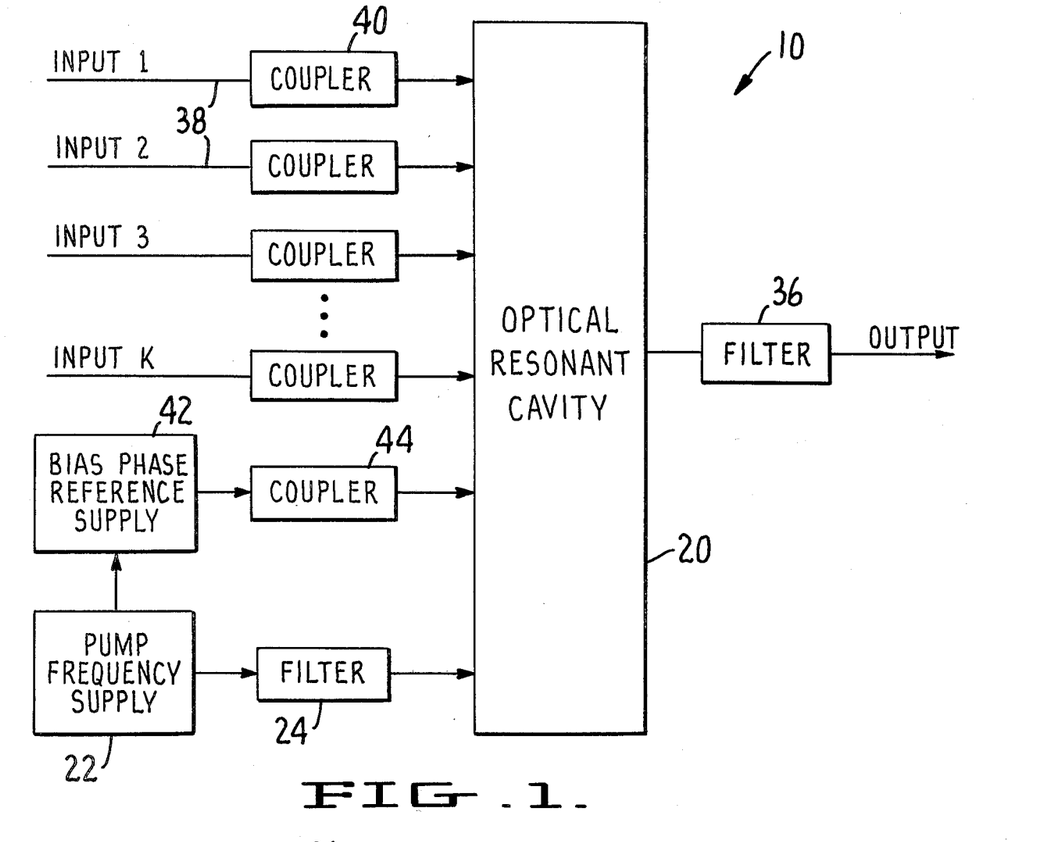
FIG. 1 is a schematic diagram illustrating an optical parametric logic gate of the subject invention.

Referring to FIG. 1, an optical parametric gate 10 is illustrated which is capable of performing a logical operation on an incoming signal. The optical parametron 10 shown defines the basic building block of a high speed digital computing system.

The parametron 10 of the subject invention includes an optical resonant cavity 20. Many techniques for constructing an optical resonant cavity are well known in the art and include X-ray photolithography and electron lithography. The cavity 20 is fabricated with a nonlinear optical material and will generate a subharmonic frequency f in response to an input frequency 2f. It is envisioned that light frequencies utilized would be greater than $10^{14}$ Hz. Accordingly, if a cavity formed with a resonant quality factor "Q" of approximately $10^2$, it will be possible to achieve logical rates greater than $10^{12}$ Hz.

Figure 2:
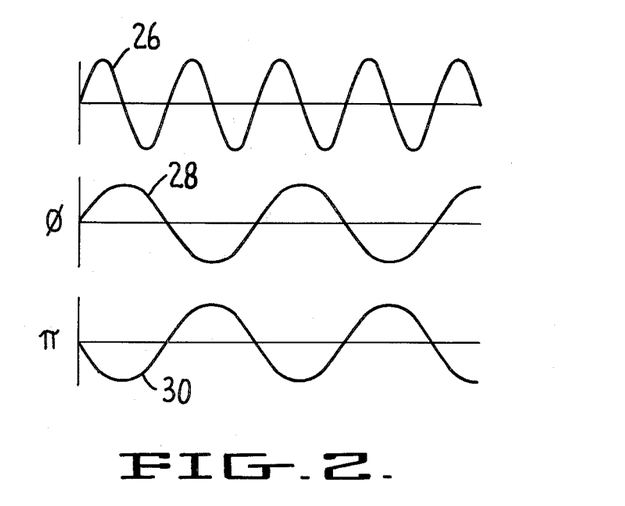
FIG. 2 is a graphic representation illustrating the relationship between the input pump frequency and the output subharmonics associated with an optical parametric logic gate of the subject invention.

Resonant cavity 20 is powered by a pump frequency supply means 22. Supply means 22 is capable of generating an optical signal, having a frequency twice that of the subharmonic frequency f, as illustrated by curve 26 in FIG. 2. In a typical computer configuration, the pump power supply will be pulsed, as more fully described hereinbelow. Preferably, a filter 24, which only passes optical signals having a frequency 2f, is interposed between pump supply 22 and cavity 20. Filter 24 is provided to prevent the logic frequency signal at the cavity from cross-coupling between gates through pump supply 22.

In operation, the pump frequency 2f is fed to resonant cavity 20. When sufficient power from the pump has built up to overcome cavity losses, the power is transferred to the subharmonic frequency f and a steady oscillation is generated, phase-locked to the pump frequency. The output subharmonic will have one of two possible phases, illustrated by curves 28 and 30 in FIG. 2. The two output signals 28, 30 differ by 180° or $\pi$ radians. As can be appreciated, the different phases can be used to represent binary bit information, 1 or 0, respectively.

Similar to the parametrons of the prior art, the phase of the subharmonic frequency can be controlled by supplying a subharmonic seed signal of the desired phase. As long as the seed signal is present during the initial buildup of the pump power, the phase of the seed signal will be imparted to the subharmonic. The power of the seed input signal can be significantly less than the power of the pump supply. However, since the power generated by the pump is transferred to the output subharmonic, the parametron is effectively an amplification device for boosting the power of the seed input signal. This amplification permits the subharmonic output signal of the resonant cavity 20 to be supplied to a number of different downstream gates. Preferably, a filter 36 is provided at the output of cavity 20 to prevent the pump power signal from leaving the cavity.

In a typical optical parametron 10, formed in accordance with the subject invention, one or more input signals are supplied to cavity 20. The inputs, labelled 1 through K in FIG. 1, are connected to cavity 20 through couplers 40. Couplers 40 may be constructed so as to pass a predetermined amount of optical power into the cavity for a given input optical signal amplitude. The couplers are analogous to the resistors in a resistor/transistor logic gate, and are selected to achieve the particular logic operation desired.

The optical output emitted from cavity 20 can travel in either the forward or rearward directions. In some pump systems, the rearward signal could cause an unwanted interference with the upstream logic gates. In those pump systems, which are discussed in detail below, the rearward signal must be blocked. This result can be readily achieved by making couplers 40 unidirectional, such that only forward or downstream signals will be allowed to pass. Directional couplers, suitable for this purpose, are well known in the art, and need not be described.

The type of logical operation performed on the input signals 38 is effectively controlled by the bias supply 42 and coupler 44. The bias supply 42 is capable of generating an optical signal having a frequency f. This signal is combined with the other inputs to produce a resultant signal, the phase of which is imparted to the subharmonic output of the cavity.

The bias frequency is passed through a coupler 44 which controls the power of the signal supplied to the cavity. Similar to couplers 40, coupler 44 can restrict the power of the bias signal reaching the cavity. In order to simplify the explanation, the smallest, or most restricted signal will be considered to have "one unit" of power. By varying coupler 44, any multiple of the basic "one unit" can be supplied to the cavity. As will become apparent below, the power level of the bias signal supplied to cavity 20 will determine the logical operation of parametric gate 10.

For purposes of explaining the logic functions, it will be assumed that the logic signals received at the cavity have "one unit" of power. The optical input signals, along with the bias input signal, are additive to form a resultant input signal. The concept of the additive nature of optical signals is well known in the art. For example, if two input signals having a phase ∅ are combined, the resultant signal will have a ∅ phase and be two units in strength. In contrast, if two input signals having opposite phases are combined, a zero level signal will result. Taking one additional example, if a signal having a ∅ phase and three units of power is combined with a signal having an opposite phase and two units of power, the resultant signal will have a ∅ phase and be one unit in strength. This well known additive nature of optical signals is relied on to construct the logic gates of the subject invention. Having described the basic format of the parametric gate, examples of particular logic gates will now be discussed.

In digital logic, a majority gate functions to generate an output signal representative of the majority of the input signals. For example, assuming there are five inputs, if three inputs are binary "ones" and two are binary "zeros", the output signal would be a binary "one".

The parametron 10 of the subject invention can be configured to function as a majority gate. More particularly, in the situation of an odd number of inputs, all of which have one unit of power, a majority gate is defined when no bias power is supplied. As can be appreciated for any odd number of inputs 1 through K, the summation or resultant input signal will be either ∅ or $\pi$-phased, as determined by the majority of the inputs. The power level of the resultant input signal is unimportant. The resultant input signal will function as a seed and impart its phase to the subharmonic output signal generated by cavity 20. The effective parametric amplification of the resultant input signal is related to the power of the pump and is preferably on the order of $10^2$ to $10^3$. This effect permits the output subharmonic to be supplied to a plurality of downstream gates.

A logical "AND" gate functions to generate a one or positive signal when all of the inputs thereto are positive. In contrast, if any one of the inputs is zero, a zero output must be generated. An optical parametric AND gate is constructed by passing (K−1) units of ∅ phase bias power into cavity 20. Thus, for K number of inputs, each and every input would have to have a $\pi$-phased signal in order to render the resultant input signal $\pi$-phased. If any input is not $\pi$-phased, the resultant input will be ∅-phased, such that the output of the resonant cavity 20 will be ∅-phased. In contrast, where every input is $\pi$-phased, the resultant input is $\pi$-phased such that a $\pi$-phased subharmonic will be generated.

A logical OR gate will generate a one or positive output if any of the inputs are positive. Conversely, an OR gate will only generate a zero signal when all of the inputs are zero. An optical parametric OR gate is constructed by supplying (K−1) units of $\pi$-phased bias power to the cavity. Thus, if any one of inputs 38 are $\pi$-phased the output subharmonic will be $\pi$-phased. Conversely, the subharmonic output will be ∅-phased only in the situation where every input is ∅-phased which leads to a resultant input seed signal having a ∅ phase.

The logical "delay" and "inversion or negation" operations can be carried out without the use of a parametric oscillator. More particularly, these functions can be introduced simply by adjusting the path length to the next optical gate. For a delay line, the path length should be equal to an integral number of wavelengths. In contrast, a logical negation can be generated by adjusting the path length to the next optical gate to be equal to an odd number of wavelengths divided by 2.

As is well known in the art of parametric logic elements, exemplified in the earlier cited references, a digital system of any complexity can be synthesized by combining the basic gates discussed above, specifically "and", "or", majority delay and negation. As mentioned above, the parametric amplification permits logical branching to enable the construction of more complex logical gates.

The biphase subharmonic oscillation of parametrons allows the use of combinations of such devices to perform data storage and processing functions. In operation, parametrons may be connected in cascade fashion with the output signal of one parametron serving as the control input signal of the next parametron. Various pump control systems are possible, each having certain inherent advantages and disadvantages. The following discussion will illustrate three potential pump control systems for use in a parametric computer. It is to be understood, however, that the scope of the subject invention is not limited to the control systems described.

As discussed above, optical pump power is supplied to a parametron to enable it to perform its logical function. The period which the pump power is on must be long enough for cavity power to reach the steady state. In addition, the pump power must decay to near zero so that the subharmonic output signal does not interfere with the next incoming input signal. The period which the pump power is "on" is dependent upon the resonant quality factor "Q" of the cavity. The higher the "Q", the longer the buildup and decay periods. "Q" cannot be too low because signal amplification is proportional to "Q". Signal amplification of at least twenty is desirable if the output subharmonic is to be supplied to ten downstream gates. Therefore, assuming an optical resonant quality factor of 50, it would require approximately 100 cycles of pump frequency to permit the required buildup and decay period necessary to carry out the logical operation. For optical pump power frequencies on the order of $10^{14}$, the maximum logic frequency would be on the order of fp/200, where fp is the pump frequency.

Figure 3:
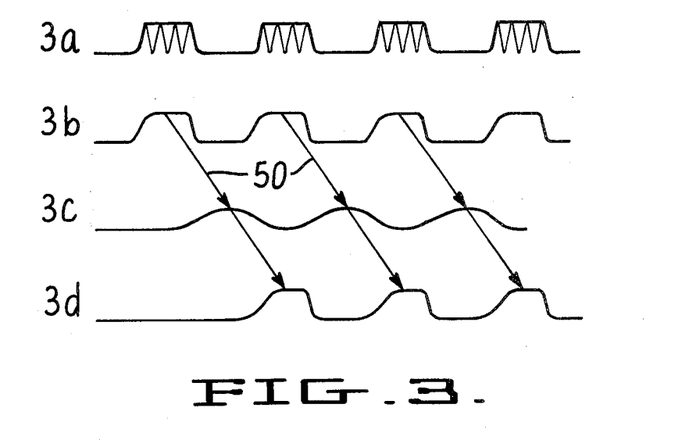
FIG. 3 is a graphical representation of an optical parametric computing system utilizing a one-phase pump arrangement.

As discussed above, for each operation of the logic gate, 100 cycles of the pump frequency must be supplied. This pulsed pumping can be supplied by a laser optical circuit, well known in the art. Referring to FIG. 3A, a graphic representation of the pump power supplied to the gates is illustrated. The vertical axis of the graph corresponds to the magnitude of optical power, while the horizontal axis corresponds to time. In a one-phase pump system, pump frequency is applied to all gate levels at the same phase. Each envelope 50, contains a plurality of cycles of the pump frequency, the number of which is dependent on the "Q" of the logic gate.

FIG. 3b illustrates the subharmonic logical output from "level one" gates. The output subharmonic signal is supplied to "level two" gates, in cascade fashion, (arrows 50) through direct coupling or branching. As discussed above, if phase inversion or negation is desired, the path length between the first and second level gates can be adjusted. FIG. 3C illustrates the character of logic input power received at the second level gates. It will be seen that the power level is relatively small. However, since the parametron gate acts as an amplifier, the subsequent pump cycle will boost the signal such that the output of the level two gates, represented by graph 3d, is similar to the output the level one gates.

In the one-phase pump system, the delay inherent in the propagative path is used to adjust the timing of the arrival of the output signal to the input of the receiving gate. The use of two gate levels in FIG. 3 is shown for clarity only. More particularly, the output of any gate can be fed to any other gate including back to itself if, for example, latch functions are desired.

Figure 4:
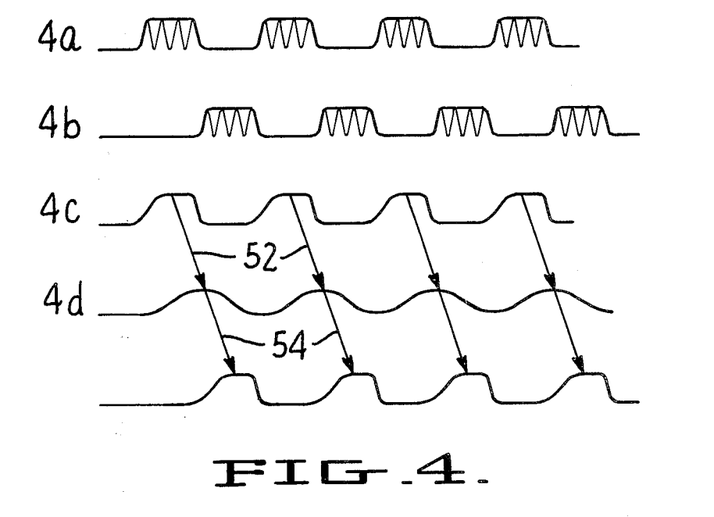
FIG. 4 is a graphical representation of an optical parametric computing system utilizing a two-phase pump arrangement.

Referring to FIG. 4, a system having a two-phase pump will be described. More particularly, in a two-phase pump system, pump power of different phases is applied to different level gates for doubling the speed of operation of the device. For example, FIG. 4A illustrates the pump frequency of one phase supplied to level one gates. In contrast, FIG. 4B illustrates the pump power supplied to level two gates. The phase of the level two gates is opposite that of the level one gates.

FIG. 4C represents the output from level one gates. FIG. 4D corresponds to the subharmonic output power which reaches the level two gates. Little or no propagation delay is needed along this path, indicated by arrows 52. This subharmonic power is used as a seed (arrows 54) which is amplified by the pump power supplied to the level two gates. This combination will produce an output subharmonic in the level two gates, as illustrated in FIG. 4E.

As can be appreciated, the speed limitation of each gate due to the buildup and decay of pump power, is identical to that found in the single phase pump system. However, in the two-phase pump system, two logic level operations can be carried out in each pump cycle. Thus, with a cavity having a "Q" of 50, a logic rate of fp/100 could be expected. Another advantage to the two-phase pump system relates to the ease of fabrication of the gate elements. More particularly, in a one-phase pump system, intentional propagation delays between gate levels of ½ to ¾ of a pump cycle are necessary. In contrast, little or no propagation delay is necessary in a two-phase system. Of course, the propagation path must still be precise to within a small fraction of the logic frequency period in order to pass the phase information to the next level accurately. In addition, the output of the level one gates must go to the input of the level two gates and vice versa.

Figure 5:
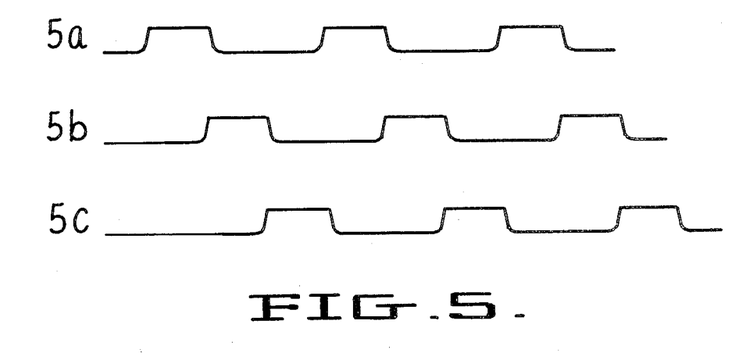
FIG. 5 is a graphical representation of a three-phase pump arrangement.

Another possible pump system includes three phases. FIG. 5 illustrates the pump system necessary to supply three gate levels. In this system, a three phase pump cycle is utilized, which is also referred to as three-beat excitation. Similar to the two-phase system, each of the parametrons in the first group (level one) are simultaneously excited into oscillation, while the second and third groups are excited during the second and third phases of the pump cycle. The excitation periods will slightly overlap to permit the transfer of information between parametrons of adjacent groups. More particularly, Group 1 parametrons transmit information to Group 2, Group 2 to Group 3 and Group 3 back to Group 1.

The advantage of the three-phase system is that there is always an inactive gate in the preceding level. Since there is an inactive gate, the need for directional couplers between the parametrons is obviated. As mentioned above, light emitted from the parametrons travels in both the forward and rearward directions. In the one and two-phase pump systems, the backward going light must be prevented from reaching the previous gate such that directional couplers are necessary. In contrast, in a three-phase pump system the rearward gate is inactive, such that simple, nondirectional couplers can be utilized. The disadvantage inherent in a three-phase pump system is that is is relatively complex to implement.

Having reviewed the basic optical parametric logic gate and potential computer pump configurations, the subject disclosure will now address various interface considerations. As can be appreciated, in order to have an operable device there must be provided means for converting binary information into optical phase information and for converting the optical phase information back into binary data output. Typical digital computers represent binary information with high/low voltage pulses. Accordingly, the following proposed interfaces are intended to be compatible with electrical information transfer.

Figure 6:
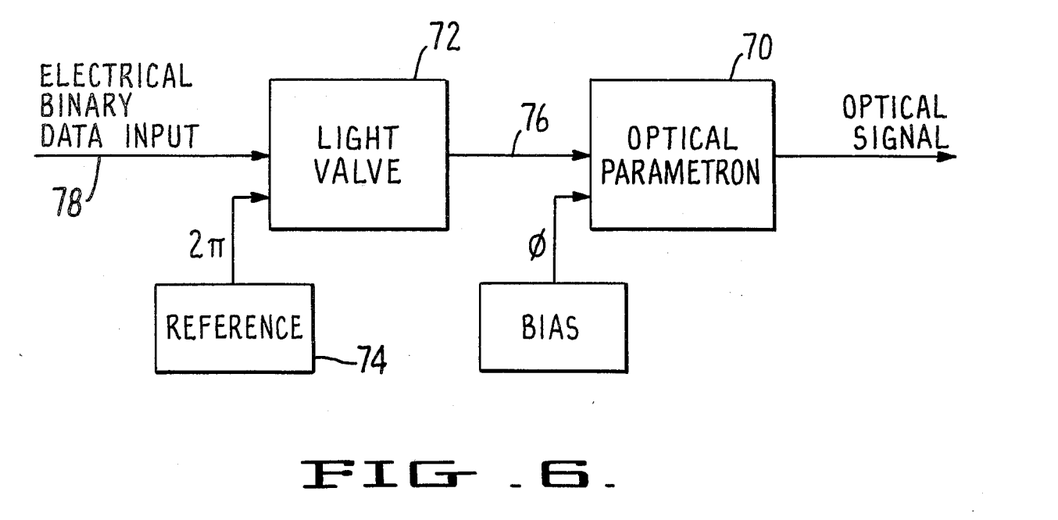
FIG. 6 is a schematic diagram illustrating one form of input interface adapted for use in an optical parametric computing system.
Figure 7:
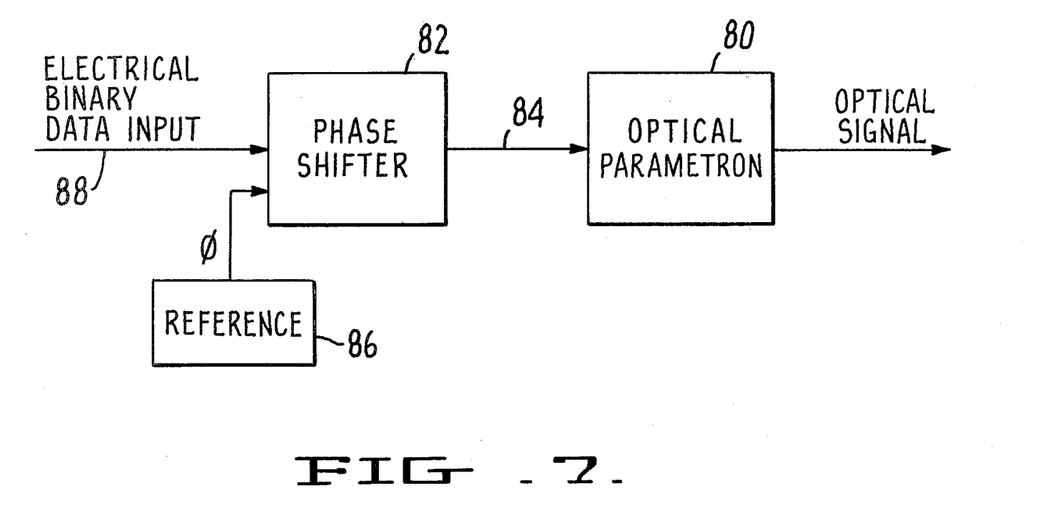
FIG. 7 is a schematic diagram of an alternate embodiment of an input interface adapted for use with an optical parametric computing system.

Referring now to FIGS. 6 and 7, two input interfaces are disclosed. The interface illustrated in FIG. 6 includes an optoparametron 70 coupled to a light valve 72. Light valve 72 functions as an on-off switch to permit light received from reference input 74 to be output along line 76 to the gate 70. The operation of the light valve is controlled by an incoming electrical signal, along line 78, carrying the on-off bit information.

Reference 74 passes an input signal having two units of power that is $\pi$-phased (where $\pi$-phased corresponds to binary 1). Optoparametric gate 70 is provided with a bias input signal one unit in strength and is $\emptyset$-phased. In operation, when information bits equalling binary zero (low voltage level) are received at input 78, the light valve remains inactive and the resultant input signal to the optoparametron is $\emptyset$-phased, such that the output subharmonic is $\emptyset$-phased. In contrast, light valve 72 is activated whenever a binary 1 (high signal) is supplied thereto. When the light valve is activated, it passes the two-unit $\pi$-phased signal to the optoparametron. In the latter case, the resultant input signal to the gate is $\pi$-phased, so that the subharmonic output is $\pi$-phased representing a binary 1.

The information rate of the proposed optical computing system is considerably faster than known digital systems. Accordingly, the interface must be structured to speed up the information transfer. This can be accomplished by a parallel to serial conversion, wherein information is supplied to the input interface in parallel fashion, to be converted to serially formated data.

An alternate embodiment of an input interface, shown in FIG. 7, also includes an optoparametric gate 80. The interface further includes a phase shifter 82 which is coupled to the parametron 80 along line 84. The optoparametric gate 80 is not provided with a separate bias input as in the first embodiment.

Phase shifter 82 is supplied with a one-unit reference signal 86 having a $\emptyset$ phase. Data information in the form of electrical voltage pulses is voltage signal (binary 1) is received through electrical input 88, shifter 82 functions to phase shift the input reference signal 86, $\pi$ radians. The $\pi$ phase shifted signal is then supplied along line 84 to optoparametric gate 80, such that the resultant output subharmonic is $\pi$-phased corresponding to a binary 1.

Figure 8:
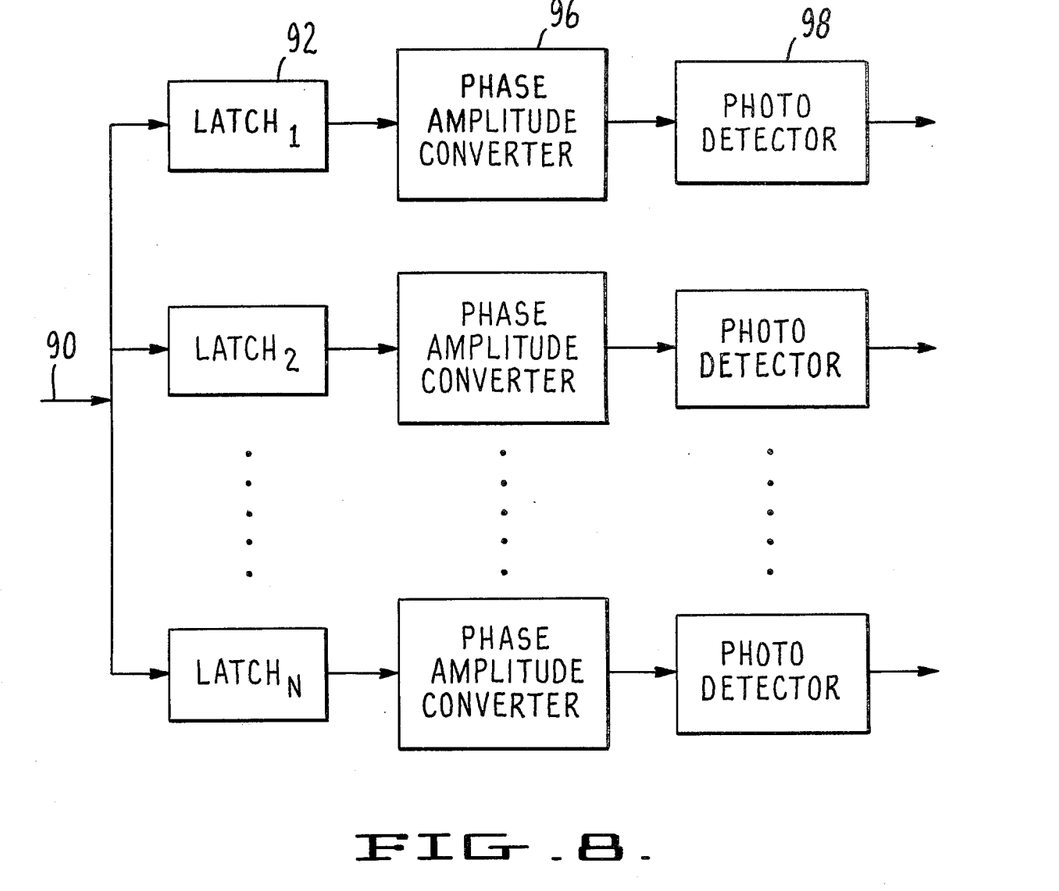
FIG. 8 is a schematic diagram of an output interface adapted for use with an optical parametric computing system.
Figure 9:
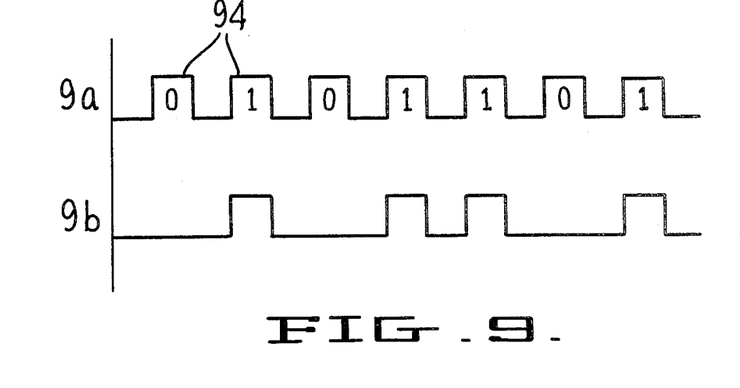
FIG. 9 is a graphical representation of the output signal generated by the output interface illustrated in FIG. 8.

Having described two forms of optical input interfaces, one type of optical output interface will now be discussed. More particularly, and referring to FIGS. 8 and 9, optical logic signals are supplied along line 90 to a plurality of latches 92. The distribution of the data bits to the latches functions to perform a serial to parallel operation. One example of a possible waveform, which may be received in latches 92, is illustrated in FIG. 9a. Each envelope contains a plurality of cycles of phase coded signals representative of either binary 1 or 0.

The phase coded signals may be converted to an amplitude output by mixing in an optical hybrid-ring circuit. An example of a microwave hybrid ring circuit can be found in "Microwave Parametric Subharmonic Oscillators for Digital Computing" by Fred Sterzer, Proceedings of the IRE, August 1959, page 1317. The thin film integrated optical equivalent of strip-line microwave phase-amplitude converter can easily be fabricated by known techniques. Utilizing a phase amplitude converter 96, the input illustrated in FIG. 9a can be converted to a waveform illustrated in FIG. 9b. As can be seen, envelopes containing $\emptyset$-phased signals result in a zero amplitude waveform while envelopes having a $\pi$-phased signal result in a waveform with an amplitude of 1.

The signals generated by the phase-amplitude converter are sensed by a photodetector 98. As can be appreciated, the response speed of a photodetector is considerably below the speed at which the optical computer may operate. Accordingly, the data output is first converted from serial to parallel format to gain added speed. In addition, the data in the latches are allowed to remain for sufficient time such that the photodetector can output the signal at the envelope rate.

Since an optoparametron computer would be anywhere from 100 to 1,000 times faster than any other known type of computer, the input/output operations must be highly parallel. A 32×32 per bit array should be sufficient to match speeds of the computer and the peripheral. However, it is contemplated that the optical parametric computer would be more likely to be used in array processing, including matrix inversion and math transformations, wherein as many as 1,000 program execution steps would be carried out per input/output operation. In this situation, anywhere from 1 to 16 interfaces per bit would be adequate.

In summary, there has been provided a new and improved optical computing system which has as its basic unit an optical parametric logical gate 10. The optical parametric gate 10 includes an optical resonant cavity 20 having nonlinear output characteristics. The cavity is supplied with a pump signal having a frequency 2f. When the cavity is supplied with sufficient power, it will generate a subharmonic signal having a frequency f. The subharmonic output signal will have one of two possible phases which differ by $\pi$ radians to one another. The phases can be used to represent binary 1 and 0, respectively. A bias supply is connected to the resonant cavity and generates an optical reference signal which is summed with the other input signals to produce a resultant or seed input signal having one of the two possible phases. The phase of the seed input signal is imparted to the subharmonic output signal from the cavity. The desired logic of the optical gate can be achieved by adjusting the power of the bias signal. The subject disclosure describes the construction of some particular logic gates. Various pump systems, including one, two and three phase arrangements were disclosed. In addition, some representative input/output interfaces were also disclosed.

While the subject invention has been described with reference to a preferred embodiment, it is to be understood that various other changes and modifications could be made therein by one skilled in the art, without varying from the scope and spirit of the subject invention as defined by the appended claims.

What is claimed is:

1. An optical gate for performing a logical operation on optical input signals having a frequency f comprising:

pump frequency supply means for generating an optical pump signal having a frequency 2f;

optical resonant cavity means connected to said pump frequency supply means, said cavity means having non-linear optical characteristics such that when said pump signal, received by said cavity means from said supply means has sufficient power, said cavity means will generate a subharmonic output signal having a frequency f, said output signal having one of two possible phases which differ by $\pi$ radians to one another, said two phases being representative of binary 1 and 0, respectively; and bias supply means connected to said optical resonant cavity means and generating an optical reference signal having a frequency f, with the power level of said bias signal being adjusted to reflect the type of gate logic desired, whereby any optical input signals supplied to said cavity means are summed with said bias supply signal to produce a resultant seed input signal having one of said two phases, with said one phase being imparted to said output signal from said cavity means.

2. An optical gate as recited in claim 1 for performing a logical majority function, said majority gate receiving an odd number of optical input signals, each of equal power, wherein said bias supply means is adjusted to provide no power to said cavity means whereby said optical input signals are combined to generate a resultant seed signal having a phase corresponding to the majority of inputs, with the phase of the seed signal being imparted to the output subharmonic of said cavity means.

3. An optical gate as recited in claim 1 for performing logical AND/OR functions, said AND/OR gate receiving K number of optical input signals each of equal power, where the power of the reference signal supplied to said cavity means by said bias supply means is adjusted to be equal to (K−1) times the power of one said input signal, said gate functioning as an OR gate with respect to input signals of the same phase as said reference signal and with said gate functioning as an AND gate with respect to input signals having the other, remaining phase.

4. An optical gate as recited in claim 1 wherein said optical input signals are connected to said cavity means via direct couplers for preventing the optical subharmonic output signal of said cavity from traveling back along the input path.

5. In combination with optical gate as recited in claim 1, an input interface for converting electrical signals carrying binary information into corresponding optical signals, said interface comprising:

a light valve means connected to said optical gate, said light valve means being actuated in response to said electrical information signals, such that when an electrical information signal corresponding to one of said two binary values is received by said light valve means, a reference signal is supplied to said optical gate by said light valve means, said reference signal being at least twice as strong as said bias signal supplied to said gate and of opposite phase such that the resultant seed input signal has the phase of the reference signal, and wherein when an electrical information signal corresponding to the other remaining binary value is received by said light valve means, said light valve remains inactive and will not supply any reference signal to said gate whereby the resultant seed input signal acting on said gate has a phase corresponding to the phase of said bias signal.

6. In combination with an optical gate as recited in claim 1, an input interface for converting electrical signals carrying binary information into corresponding optical signals, wherein the bias supply means of said optical gate is adjusted to supply no power to said cavity means, said input interface comprising:

phase shifter means connected to said optical gate, said phase shifter means receiving an optical reference signal having one of said two possible phases, wherein when an electrical information signal corresponding to one of said two binary values is received by said phase shifter means, said reference signal is supplied directly to said gate and functions as the seed input signal thereto and when an electrical information signal corresponding to the other remaining binary value is received by said phase shifter means, the phase of said reference signal is shifted to correspond to the other remaining phase, with said phase shifted signal being supplied to said gate to function as the seed input signal thereto.

* * * * *